United States Patent
Sharma et al.

(10) Patent No.: US 7,600,208 B1
(45) Date of Patent: Oct. 6, 2009

(54) AUTOMATIC PLACEMENT OF DECOUPLING CAPACITORS

(75) Inventors: Harsh Dev Sharma, Santa Jose, CA (US); Rajeev Srivastava, Cupertino, CA (US); Srivinas R. Kommoori, Milpitas, CA (US); Bharat Bhushan, Santa Clara, CA (US); Mithunjoy Parui, Mountain View, CA (US); Albert Lee, Livermore, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 93 days.

(21) Appl. No.: 11/669,872

(22) Filed: Jan. 31, 2007

(51) Int. Cl.
G06F 17/50 (2006.01)
(52) U.S. Cl. .................. 716/11; 716/5; 716/10
(58) Field of Classification Search ............. None
See application file for complete search history.

(56) References Cited

U.S. PATENT DOCUMENTS

| | | | | |
|---|---|---|---|---|
| 3,619,735 | A | | 11/1971 | Chen et al. |
| 5,587,333 | A | | 12/1996 | Johansson et al. |
| 6,477,694 | B1 | * | 11/2002 | Irino et al. .............. 716/15 |
| 6,523,156 | B2 | | 2/2003 | Cirit |
| 6,523,159 | B2 | * | 2/2003 | Bernstein et al. ........... 716/10 |
| 6,532,439 | B2 | * | 3/2003 | Anderson et al. .......... 703/14 |
| 6,550,037 | B2 | * | 4/2003 | Ando et al. ............... 716/1 |
| 6,640,331 | B2 | * | 10/2003 | Trivedi et al. ............. 716/10 |
| 6,671,866 | B2 | | 12/2003 | Arsintescu |
| 6,789,241 | B2 | * | 9/2004 | Anderson et al. .......... 716/5 |
| 6,807,656 | B1 | * | 10/2004 | Cao et al. ................. 716/4 |
| 6,898,769 | B2 | * | 5/2005 | Nassif et al. .............. 716/5 |
| 6,937,971 | B1 | * | 8/2005 | Smith et al. .............. 703/18 |
| 7,222,320 | B2 | * | 5/2007 | Ogawa .................... 716/11 |
| 7,225,418 | B2 | * | 5/2007 | Shimazaki et al. .......... 716/6 |
| 7,245,516 | B2 | * | 7/2007 | Inoue ..................... 365/51 |
| 7,269,806 | B2 | * | 9/2007 | Berry et al. ............... 716/4 |
| 7,278,120 | B2 | * | 10/2007 | Rahmat et al. ............. 716/2 |
| 7,302,664 | B2 | * | 11/2007 | Haridass et al. ........... 716/10 |
| 2003/0212538 | A1 | * | 11/2003 | Lin et al. ................. 703/14 |
| 2003/0212973 | A1 | * | 11/2003 | Lin et al. ................. 716/6 |
| 2006/0143585 | A1 | * | 6/2006 | Satoh et al. .............. 716/5 |
| 2008/0098335 | A1 | * | 4/2008 | Allen et al. .............. 716/2 |
| 2008/0134103 | A1 | * | 6/2008 | Zhao et al. ............... 716/2 |

OTHER PUBLICATIONS

Chen et al., "On-chip decoupling capacitor optimization for high-performance VLSI design," 1995 Proceedings of Int'l Symposium on VLSI Technology, Systems, and Applications, pp. 99-103.*

(Continued)

*Primary Examiner*—Leigh Marie Garbowski
(74) *Attorney, Agent, or Firm*—Alford Law Group, Inc.; William E. Alford; Sang Dang

(57) ABSTRACT

Disclosed are methods, systems and apparatus for automatically placing decoupling capacitors in an integrated circuit to compensate for voltage drops that might otherwise occur in a power grid. In one embodiment of the invention, the method includes generating one or more regions of the integrated circuit design, with each region having one or more cells, determining an amount of decoupling capacitance required in each region of the integrated circuit design by analyzing each cell in the region, and adding sufficient decoupling capacitor cells to the region to compensate for the potential voltage drop.

26 Claims, 12 Drawing Sheets

OTHER PUBLICATIONS

Yan et al., "Floorplan-aware decoupling capacitance budgeting on equivalent circuit model," 2006 IEEE, ISCAS 2006, pp. 1792-1795.*

Su et al., "Optimal Decoupling Capacitor Sizing and Placement for Standard-cell Layout Designs," IEEE Transactions on CAD of ICs and Systems, vol. 22, No. 4, Apr. 2003, pp. 428-436.*

Chen et al., "On-chip decoupling capacitor optimization for noise and leakage reduction," Proceedings of the 16$^{th}$ Symposium on ICs and Systems Design (SBCCI-'03), 2003 IEEE, 5 pages.*

Zhao et al., "Decoupling capacitance allocation and its application to power-supply noise aware floorplanning," IEEE Trans. on CAD of ICs and Systems, vol. 21, No. 1, Jan. 2002, pp. 81-92.*

Pant et al., "On-chip decoupling capacitor optimization using architectural level prediction," IEEE Trans. on VLSI Systems, vol. 10, No. 3, Jun. 2002, pp. 319-326.*

Yeh et al., "Timing-aware power noise reduction in layout," 2005 IEEE, pp. 626-633.*

Na et al., "The effects of on-chip and package decoupling capacitors and an efficient ASIC decoupling methodology," 2004 Electronic Components and Technology Conference, pp. 556-567.*

Scheffer, L. Lavagno, L. Martin, G; EDA for IC Implementation, Circuit Design, and Process Technology; 2006; pp. 20.1-20.14. Taylor and Francis Group, LLC. Boca Raton, FL, USA.

* cited by examiner

| TIMING INFORMATION | | | |
|---|---|---|---|
| INSTANCE | CELL | START TIME | STOP TIME |
| U1 | CELL 2 | $TS_1$ | $TE_1$ |
| U2 | CELL 5 | $TS_2$ | $TE_2$ |
| U3 | CELL 9 | $TS_3$ | $TE_3$ |
| U4 | CELL 4 | $TS_4$ | $TE_4$ |
| U5 | CELL 1 | $TS_5$ | $TE_5$ |

FIG. 6A

| DECOUPLING CAPACITANCE INFORMATION | | |
|---|---|---|
| CELL | INHERENT DECOUPLING CAPACITANCE VALUE | NEEDED DECOUPLING CAPACITANCE VALUE |
| CELL 1 | $IDC_1$ | $NDC_1$ |
| CELL 2 | $IDC_2$ | $NDC_2$ |
| CELL 3 | $IDC_3$ | $NDC_3$ |
| CELL 4 | $IDC_4$ | $NDC_4$ |
| CELL 5 | $IDC_5$ | $NDC_5$ |
| CELL 6 | $IDC_6$ | $NDC_6$ |
| CELL 7 | $IDC_7$ | $NDC_7$ |
| CELL 8 | $IDC_8$ | $NDC_8$ |
| CELL 9 | $IDC_9$ | $NDC_9$ |
| CELL 10 | $IDC_{10}$ | $NDC_{10}$ |

FIG. 6B

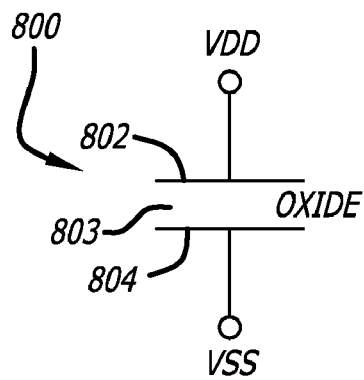
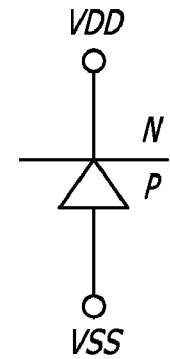
FIG. 8A    FIG. 8B
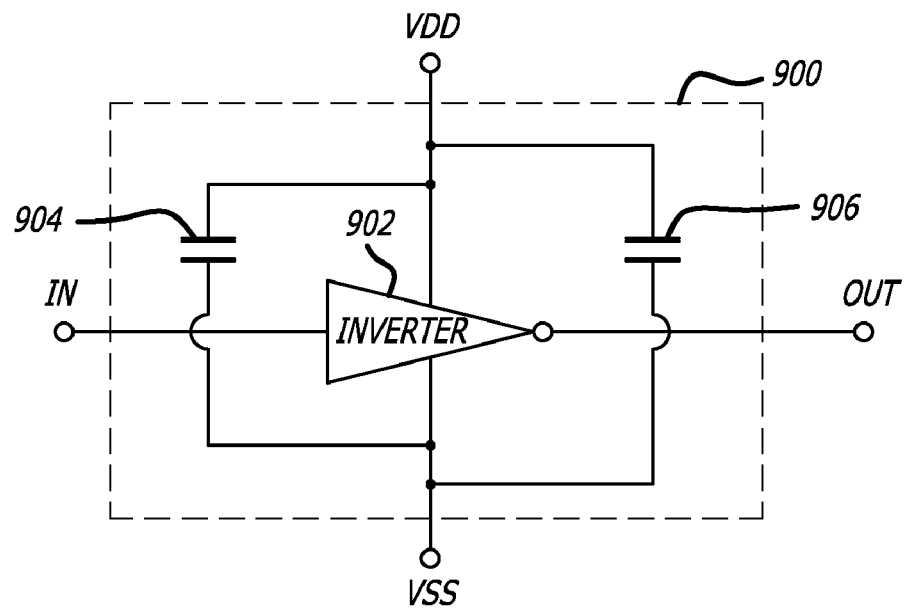
FIG. 9

| REGION 1A 5, 10 | REGION 2A 10, 2 | ··· | REGION (N-1)A 5, 5 | REGION NA 5, 20 |
|---|---|---|---|---|
| REGION 1B 10, 1 | REGION 2B 20, 5 | ··· | REGION (N-1)B 5, 50 | REGION NB 15, 40 |
| ⋮ | ⋮ | ⋮ | ⋮ | ⋮ |
| REGION 1M 10, 10 | REGION 2M 1, 5 | ··· | REGION (N-1)M 5, 5 | REGION NM RIDC, RNDC |

FIG. 11A

| REGION 1A 10, 10 | REGION 2A 8, 2 | ··· | REGION (N-1)A 5, 5 | REGION NA 20, 20 |
|---|---|---|---|---|
| REGION 1B 7, 1 | REGION 2B 20, 5 | ··· | REGION (N-1)B 30, 30 | REGION NB 40, 40 |
| ⋮ | ⋮ | ⋮ | ⋮ | ⋮ |
| REGION 1M 10, 10 | REGION 2M 5, 5 | ··· | REGION (N-1)M 5, 5 | REGION NM RIDC, RNDC |

FIG. 11B

| REGION | RIDC | RNDC | RODC |
|---|---|---|---|
| 1A | 5 | 10 | +5 |
| 2A | 10 | 2 | -8 |
| 1B | 10 | 1 | -9 |
| 2B | 20 | 5 | -15 |
| ⋮ | ⋮ | ⋮ | ⋮ |
| NM | RIDC | RNDC | RODC |

FIG. 12

AUTOMATIC PLACEMENT OF DECOUPLING CAPACITORS

FIELD OF THE INVENTION

The embodiments of the invention generally relate to electronic design automation for integrated circuits. More particularly, the embodiments of the invention relate to a system and method for automatically placing decoupling capacitors.

BACKGROUND

Integrated circuits are used for a wide variety of electronic applications, from simple devices such as wristwatches, to the most complex computer systems. A microelectronic integrated circuit chip (IC) can generally be thought of as a collection of logic cells with electrical interconnections between the cells, formed on a monolithic semiconductor substrate (e.g., silicon). An IC may include a very large number of logic cells and require complicated connections between them. A logic cell, which may also referred to herein as a standard cell or a cell, is a group of one or more circuit elements grouped together to perform a logical function. Logic cell types include, for example, core cells, scan cells and input/output (I/O) cells. Each of the cells of an IC may have one or more pins, each of which in turn may be connected to one or more other pins within the IC by wires. The wires connecting the pins of the IC may also formed on the surface and/or in one or more layers of the chip.

Cell placement in semiconductor fabrication involves a determination of where particular cells should be located in the substrate of an integrated circuit device. Due to the large number of components and the details required by the fabrication process, physical design is not practical without the aid of computers. Many phases of physical design extensively use computer aided design (CAD) tools to automate the physical design process phases have already been partially or fully automated. Automation of the physical design process has increased the level of integration, reduced turn around time and enhanced chip performance.

As IC technologies have improved with smaller device dimensions and faster switching frequencies, and greater integration, power consumption has increased such that power distribution networks in an integrated circuit have become more important. One problem in the power distribution network in an IC that has arisen with the advances in IC technologies relates to voltage drops (also referred to as IR drops) across the power distribution network. Localized voltage drops are caused by switching cells sourcing or sinking currents and drawing power through a resistive power distribution network or grid. Excessive voltage drops in the supply voltage on the power distribution network can reduce switching speeds, reduce noise margins, and cause failures in the electronic devices of the IC. Excessive voltage drops in the supply voltage on the power distribution network may be an indication of poor placement of logic cells with respect to even power distribution. It is desirable to better regulate the voltage supplied to the electronic devices in the integrated circuit over the power distribution network to address the potential voltage drops therein.

BRIEF DESCRIPTION OF THE DRAWINGS

FIGS. 6A and 6B are exemplary tables of information related to cells in the region in accordance to one embodiment of the invention.

FIGS. 8A-8B illustrate schematic diagrams of different types of decoupling capacitors.

FIG. 9 illustrates a schematic diagram of a logic cell and inherent decoupling capacitance.

FIGS. 11A-11B illustrate matrices of decoupling capacitance information in a plurality of regions over an integrated circuit.

FIG. 12 illustrates a table of decoupling capacitance information in a plurality of regions over an integrated circuit.

DETAILED DESCRIPTION

Figure 1:
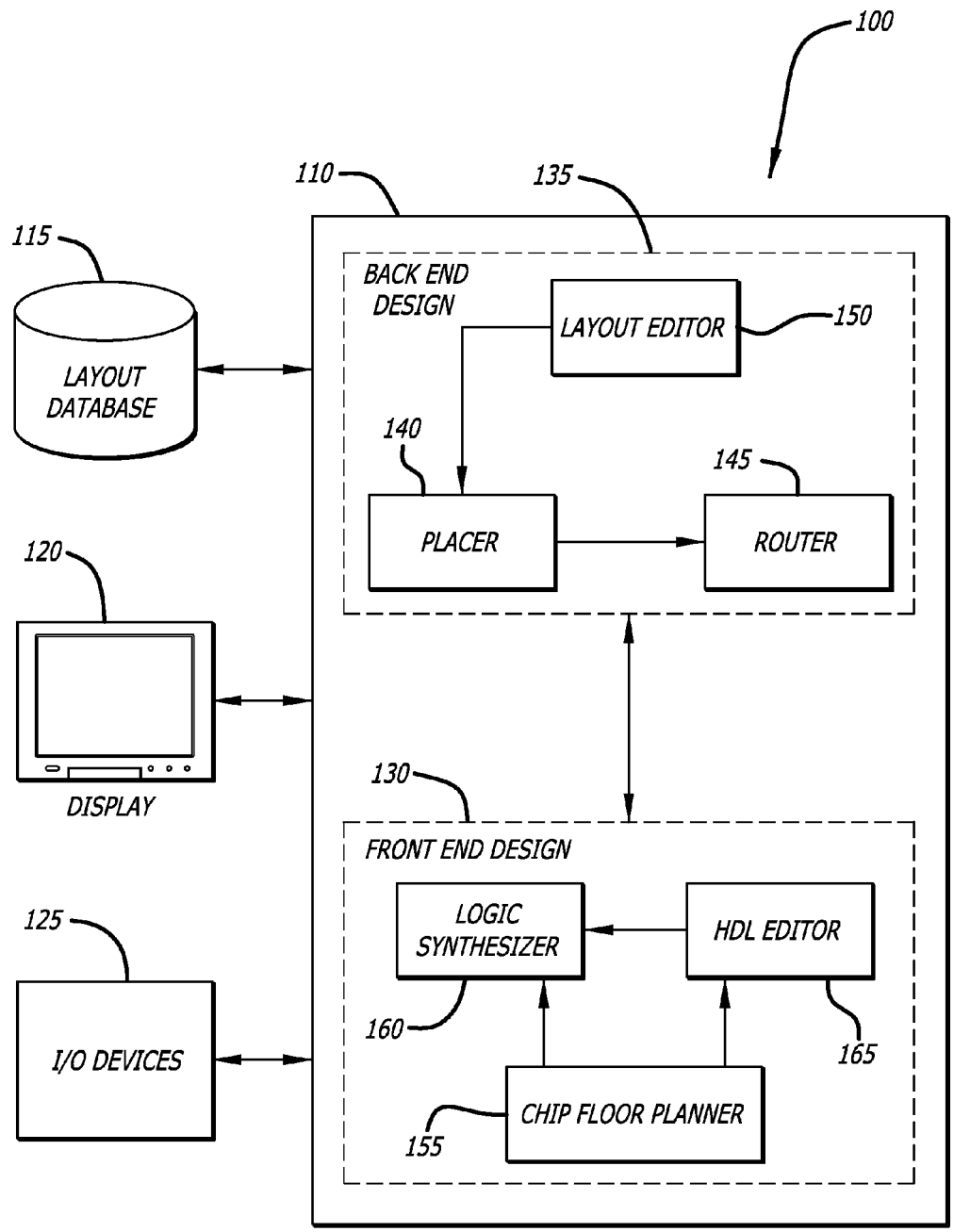
FIG. 1 is a diagram of an EDA system that may be used in connection with various embodiments of the invention.

In the following detailed description of the embodiments of the invention, numerous specific details are set forth in order to provide a thorough understanding of the embodiments of the invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

The embodiments of the invention include a method, apparatus and system for automatic placement of decoupling capacitor ("decap") cells.

Decoupling capacitor cells, also known as decap cells, are used to counter the instantaneous IR-drop (a.k.a., voltage drop) on the power rails in an integrated circuit design. Since each switching cell of the design draws power from the global power net or power grid, it creates an instantaneous local voltage drop on the power net. The decap cells compensate for the instantaneous current requirement by acting as a local voltage source. This also insures that effect of noise coupling due to common power/ground net is minimized.

However, decoupling capacitor cells do leak charges and consume power, often referred to as leakage power. If large numbers of decap cells are used and overly compensate for the IR drop, the integrated circuit may consume a greater amount of leakage power than specified and adversely affect or exceed a battery or other power requirement. This may be particularly important in portable devices where power consumption is managed and requirements for low power consumption are greater. Decap cells should be appropriately added to an integrated circuit design with the proper amount of decoupling capacitance. Decap cells should not be added where they are not needed in the integrated circuit layout. The appropriate use and addition of decap cells where they are needed is important for the performance and functionality of an integrated circuit chip, while an inappropriate and excessive use of decap cells can have an adverse affect on the performance and functionality of an integrated circuit chip. The embodiments of the invention add decap cells in an appropriate manner based on the placement and activity of logic cells of the design.

Referring now to FIGS. 8A-8B, different types of decoupling capacitor may be formed between power (Vdd) and ground (Vss) in various ways.

FIG. 8A illustrates a conductive plate type decoupling capacitor 800, sometimes referred to as an oxide capacitor. An oxide layer 803 or other dielectric type of layer (e.g., SILOX, silicon-dioxide) is formed between a first conductive plate 802 and a second conductive plate 804. The conductive plates 802, 804 are conductive and one or both may be metal or an alloy, poly-silicon, diffusion, semiconductor substrate, or other type of conductive layer in an IC design process.

In FIG. 8A, the conductive plate 802 is illustrated as being coupled to power Vdd and the conductive plate 804 is illustrates as being coupled to ground Vss. The conductive plate 802 may be formed in an upper layer while the conductive plate 804 is formed in a lower layer of the IC design. Alternatively, the conductive plate 804 may be formed in an upper layer while the conductive plate 802 is formed in a lower layer of the IC design. Alternatively, the power supply connections to the conductive plate type decoupling capacitor 800 may be swapped.

The conductive plate type decoupling capacitor 800 may be intentionally added by design or may be the result of parasitics due to overlapping positions of the spaced apart conductive layers when a circuit is layed-out.

FIG. 8B illustrates a reverse bias diode type decoupling capacitor 810, sometimes referred to as a junction capacitor. An n-type semiconductor region is coupled to a p-type semiconductor region to form a P-N junction. The n-type semiconductor region is coupled to power Vdd and the p-type semiconductor region is coupled to ground. While the positions of the layers of the n-type semiconductor region and the p-type semiconductor region may be reversed, the connections to the power supply rails cannot be swapped so as to keep the P-N junction reverse biased.

Referring now to FIG. 9, an exemplary logic cell 900 is illustrated. The logic cell 900 may include some Boolean logic gate, such as an inverter 902 for example having an input IN and an output OUT. Other Boolean logic gates may be used alone or in combination to form a logic cell with some digital circuit functionality. The inverter 902 is coupled to power Vdd and ground Vss. An intrinsic decoupling capacitance 904 may be formed in a logic cell 900 unintentionally through the manner in which the transistor devices and wire interconnect of the transistor devices to power and ground are layed-out to form the layers of the integrated circuit. This is oftentimes referred to as a parasitic capacitance. If it is known that a cell is going to be switching large currents, such as a clock buffer, a cell designer may design in an added decoupling capacitor 906 between power and ground to reduce the voltage drop at the cell. The total decoupling capacitance in a logic cell, the sum of the intrinsic decoupling capacitance 904 and the added decoupling capacitor 906 in the cell, may be referred to herein as the inherent decoupling capacitance of a cell.

Figure 10:
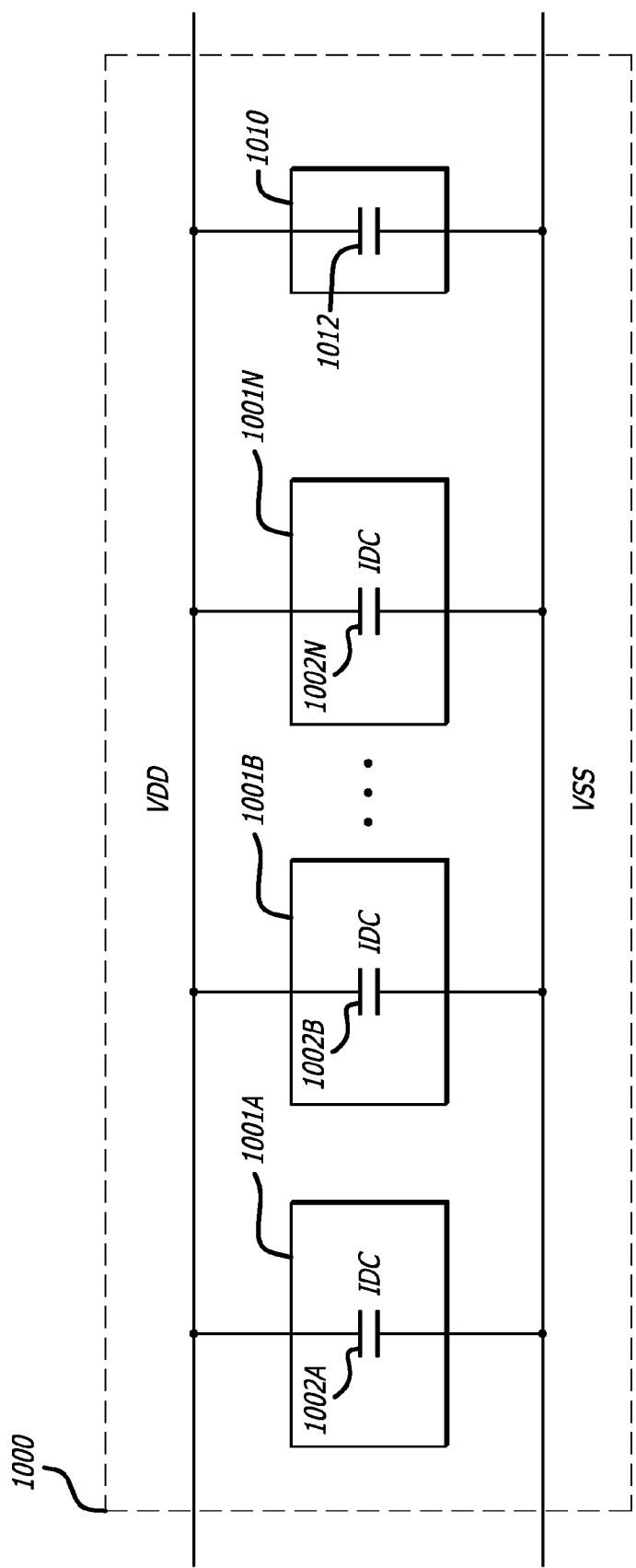
FIG. 10 illustrates a block diagram of a plurality of logic cells placed with an extrinsic decoupling capacitor cell in a region or area of an integrated circuit layout.

Referring now to FIG. 10, a region 1000 of an integrated circuit is illustrated including a plurality of logic cells 1001-1001N and an extrinsic decap cell 1010. Each of the plurality of logic cells 1001-1001N includes an inherent decoupling capacitance 1002A-1002N, respectively. If the plurality of logic cells 1001-1001N are all the same type of logic cell, the value of the inherent decoupling capacitance 1002A-1002N is the same. If the plurality of logic cells 1001-1001N are different types of logic cells (e.g., NAND, NOR, or INVERT gates), the value of the inherent decoupling capacitance 1002A-1002N may be different between the different cell types.

To better regulate the voltage drop on the power grid, the extrinsic decap cell 1010 may be added to the IC design. The extrinsic decap cell 1010 includes an intentionally designed decoupling capacitor 1012 that can be placed between power and ground in the layout of the integrated circuit design.

Decap cells have typically been added in application specific integrated circuit design ad-hoc during power analysis of a design after placement of the logic cells and routing of wire interconnect has been made to complete the layout of the integrated circuit. The decap cells were typically added in whatever location was then available. Moreover, the decoupling capacitance size and number of decap cells have typically been added based upon gross approximation rules. For example, a decoupling capacitor may have been typically added every few 1000 microns. Alternatively, below a power mesh structure, a decoupling capacitor may have been added. As these gross approximation rules tended to be overly pessimistic, more decap cells tended to be added than necessary. This can lead to undesirable effects such as increased capacitive load of the power network, non-optimal use of silicon area, and increased power consumption due to current leakage.

The embodiments of the invention add decap cells intelligently during the placement of the logic cells, as part of the cell placement process of the integrated circuit design, prior to the power analysis phase of the IC design. The algorithms disclosed herein may be used when cells are added in the IC design, such as during clocktree synthesis, design optimization etc. When placing cells during cell placement or optimizing the logic design during synthesis, the activity of each cell and net in the design can be determined. Traditionally, clock tree components are high drive cells and switch every clock cycle. It is also understood that flip-flops in a design can switch every clock cycle. Moreover, when long top level nets are used to connect pins they often require buffering with high drive cells as large capacitances are often switched. The embodiments of the invention automatically place an appropriate size and number of Decap cells adjacent to high activity regions such as these in an integrated circuit design.

FIG. 1 is a diagram of an EDA system 100 that may be used in connection with various embodiments of the invention as described herein. As shown in FIG. 1, the EDA system 100 includes a computer 110 connected to a layout database 115, and a display 120 and various input-output (I/O) devices 125. The computer 110 may comprise one or more processors (not shown), as well as working memory (e.g., RAM) in an amount sufficient to satisfy the speed and processing requirements of the system.

The computer 110 may execute stored program code for the front end or logical design 130 of an integrated circuit and the back end or physical design 135 of the integrated circuit. The software tools that may be executed by the computer 110 to perform physical design include a placer 140, a router 145, a layout editor 150, and evaluation tools. The layout editor 150 provides for the creation of layouts at a polygon level in a graphics database. The placer 140 and router 145 perform placement of cells and routing of the nets at a global level as well at a detail level in accordance with a netlist that describes the integrated circuit design.

To generate a netlist, the computer 110 may execute front end or logical design tools 130, which may include a chip floor planner 155, a logic synthesizer 160, and an HDL editor 165. As discussed previously, a netlist may be used by one or more software tools to generate the physical layout of the integrated circuit design.

The computer 110 is preferably coupled to a mass storage device (e.g., magnetic disk or cartridge storage) providing a layout database 115 with which a number of the foregoing system components interface. In one embodiment, the layout database 115 may be implemented using the EDIF (Electronic Design Interchange Format) database standard. The computer 110 may also comprise or be connected to mass storage containing one or more component libraries (not shown) specifying features of electrical components available for use in circuit designs.

The netlist, a schema of the layout database 115 of an integrated circuit, is comprised of a plurality of instances of transistors, gates, cells, blocks, modules, and other levels of circuit hierarchy and a plurality of nets. A net interconnects a number of instances, by associating pins on each of the instances or, more generally, by associating the inputs and outputs of a number of instances. The netlist is converted into the plurality of mask layers in the layout database 115 to physically manufacture the integrated circuit in a wafer fabrication facility.

Figure 2A:
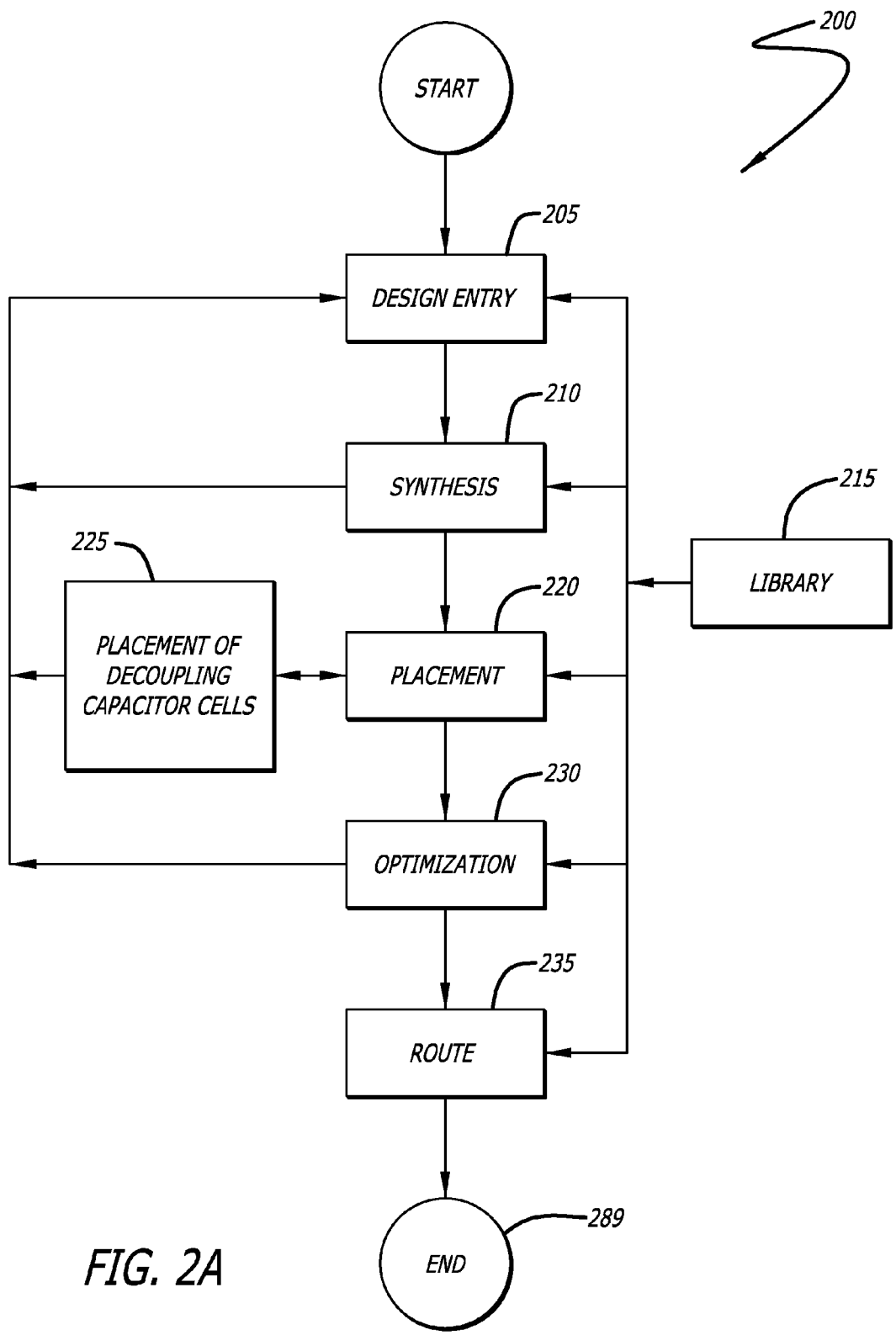
FIGS. 2A and 2B illustrate exemplary integrated circuit design flows in accordance with various embodiments of the invention.
Figure 2B:
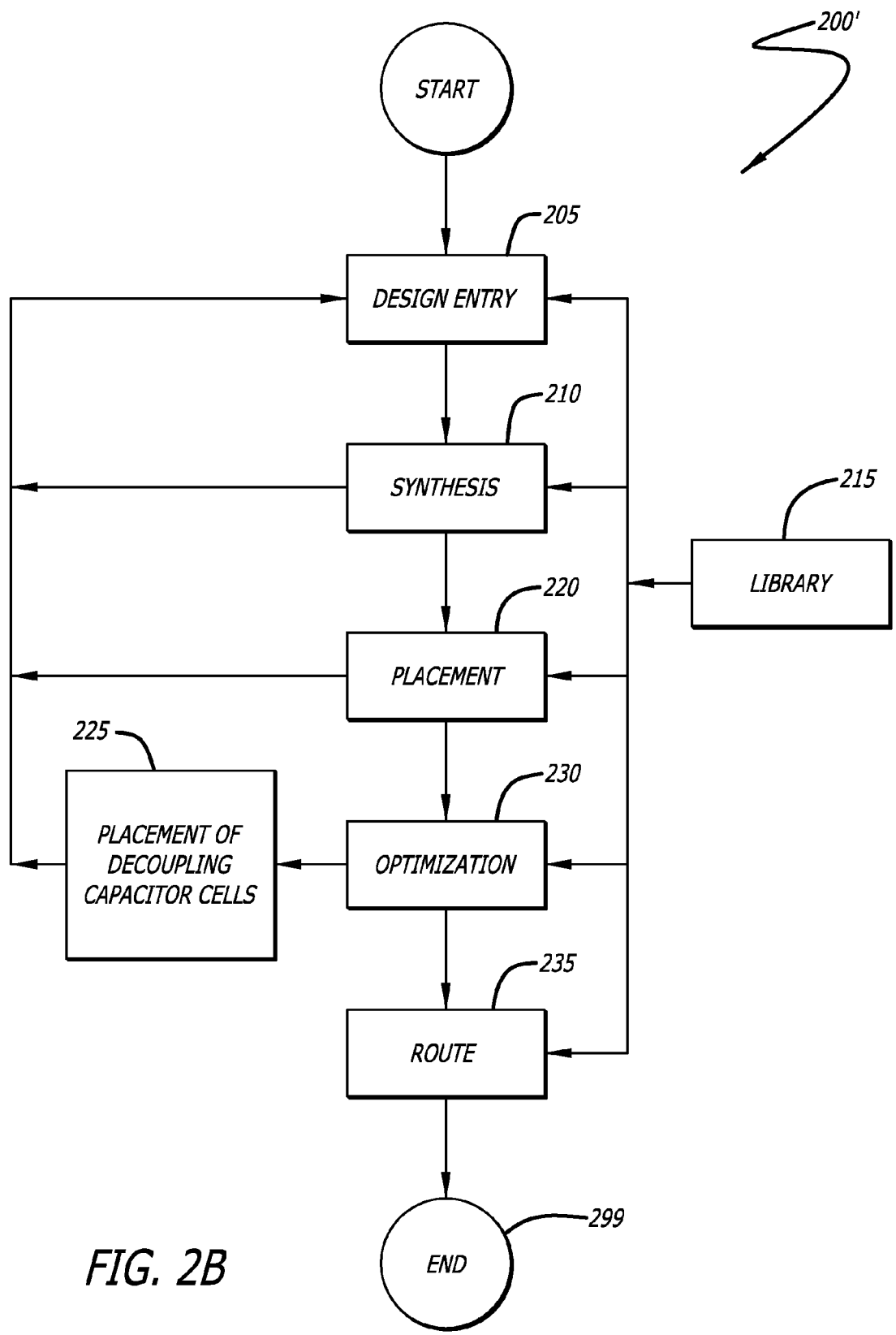

FIGS. 2A and 2B illustrate exemplary integrated circuit design flows 200 and 200' in accordance with various embodiments of the invention. Initially, the circuit's behavior is described in a high level language in a design entry process 205. Logic synthesis tools then transform the high level description into a listing of logic cells (logic netlist) and interconnection information in a synthesis process 210. The logic cells correspond to cells within a standard cell library 215. In general terms, logic circuit synthesis generates an initial circuit topology that satisfies the basic logic requirements as defined by the high level design description. The initial design can be presented graphically as a schematic and also in a data file listing the included logic elements and their interconnections. This data file is generally referred to as a netlist. Logic synthesis tools map functional groups within the high level description to cells having the same logic function. The standard cell library 215, including a plurality of logic cells, typically provides a set of discrete implementations of each logic function.

During logic synthesis, the logic cells are simulated for timing analysis purposes by a timing simulator to be sure timing requirements of the integrated circuit are met. The timing analysis performed during logic synthesis may generate timing window files that include a timing window of output switching for each logic cell in the netlist of the integrated circuit. FIG. 6A illustrates an exemplary timing window file for four logic cell instances U1 through U4 between flip flops in a given region. The timing window file for the complete integrated circuit is typically larger as there are usually more than four logic cells in today's integrated circuits.

As illustrated in FIG. 6A, the timing window file includes the instantiation label for the cell (INSTANCE), the cell name (CELL) associated with logic cell in the cell library, a start time TS from the beginning of a clock period that the output of the logic cell may be expected to initially switch, and an end or stop time TE from the beginning of the clock period that the output of the logic cell may be expected to finally switch. That is, the output of the logic cell may be expected to switch at anytime within the range between the start time TS and the end time TE. The output of the logic cell is not expected to switch earlier than the start time TS. Nor is the output of the logic cell expected to switch later than the end time TE.

After synthesis, the cells listed in the layout netlist can be obtained from the standard cell library 215 and arranged within a design layout in a cell placement process 220. The cell placement process 220 may invoke a decap placement process 225 of automatically placing decoupling capacitor (or decap) cells in each region to counter or compensate for the IR drops, in accordance with the embodiments of the invention. For example, each switching cell of the design draws power from the global power net, creating an instantaneous local voltage drop on the power net. The decap cells are added and placed to act as a local voltage source to compensate for the voltage drop, as well as to minimize the effect of noise coupling due to common power (and/or ground) net.

As shown in FIG. 2B, the optimization process 230 is typically performed after the placement process 220. Optimization may be performed to improve the timing requirements and/or the power consumption requirements of the circuit design. Furthermore as shown in FIG. 2B, the optimization process 230 may additionally or in the alternative invoke the decap placement process 225 of automatically placing decap cells over a given region, in accordance with the embodiments of the invention.

The placed and optimized cells are then routed in the routing process 235. The cells are placed and then routed together into a layout design that is equivalent to the original design description, as well as the layout design netlist. In other words, the netlist (and original high level description) is in effect transformed into a design layout having interconnected cells. The routing process 235 may include various types of net routing, including top level net routing and lower level detail routing, and power grid routing. During the net routing, wire interconnect is used to connect to the pins of the cells so that signals may propagate in the integrated circuit between cells and the pads of the integrated circuit. During power grid routing, the power and ground rails are routed in a metal layer to each of the cells in the integrated circuit, including any decap cell.

After the routing process 235, the design flow may end 289 in each of the design flows 200,200' or continue with further analysis of the integrated circuit design and its layout, such as a power analysis.

While FIGS. 2A-2B illustrate the automatic decap cell placement process occurring during placement and optimization, the automatic decap cell placement process may occur in other phases of IC design to address the issue of instantaneous power consumption and voltage drops across a power grid. For example, the automatic decap cell placement process can be performed during clock tree synthesis, routing (e.g., top level net routing), engineering change orders (ECOs), or any other step or phase in the application specific integrated circuit (ASIC) design process or flows that may involve placement of logic cells in an IC design.

Embodiments of the invention analyze each of one or more logic cells in a region to determine an optimum amount of decoupling capacitance for a given region to compensate for a potential voltage drop in the power grid. In response to the optimum amount of decoupling capacitance for the given region, embodiments of the invention add at least one decoupling capacitor cell to the integrated circuit layout in the given region in order to compensate for the voltage drop in the power grid.

Figure 3:
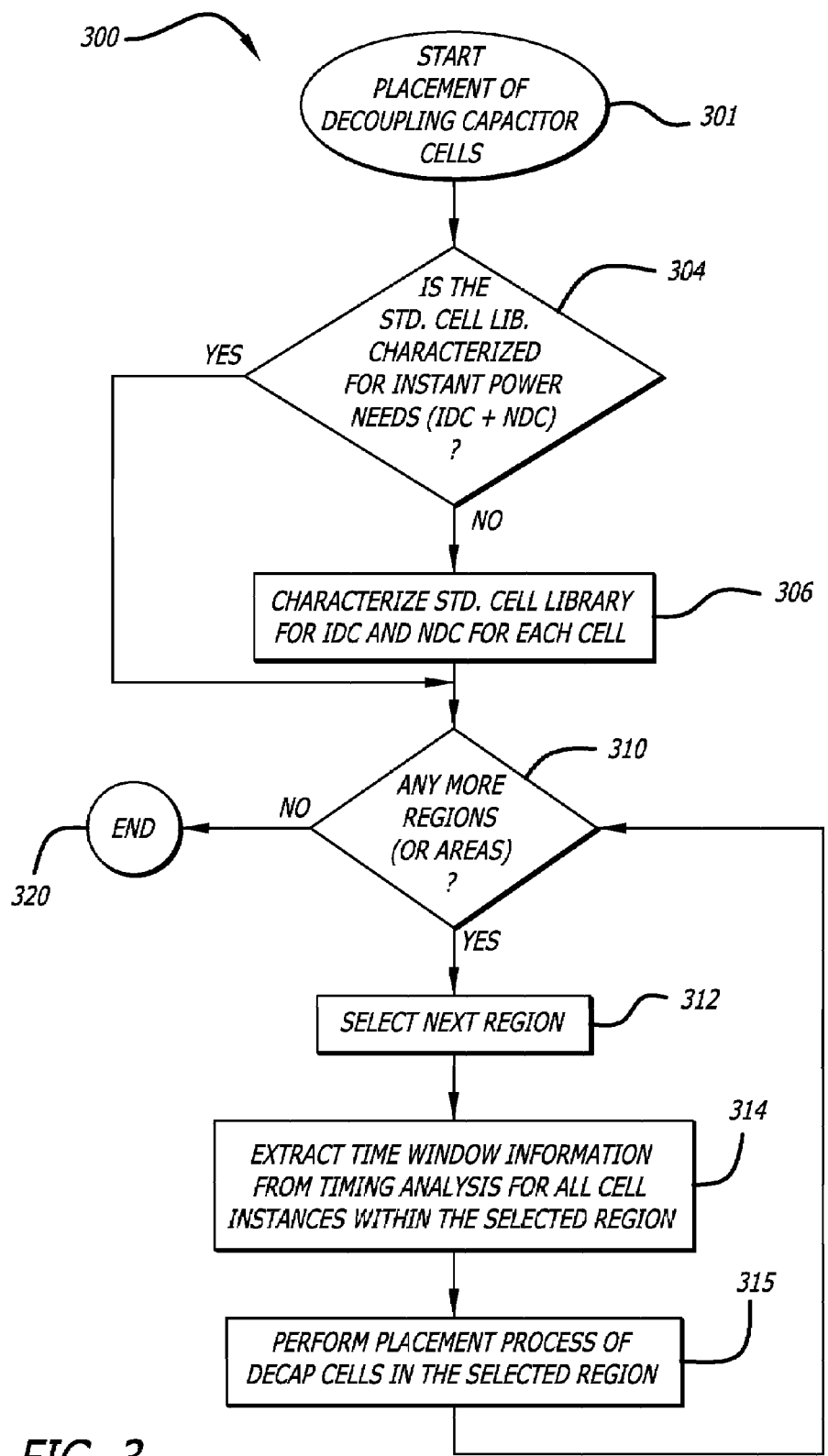
FIG. 3 is a flow chart describing the process of placing decoupling capacitor cells in a circuit design in accordance with one embodiment of the invention.

FIG. 3 is a flow chart 300 describing the process of placing decoupling capacitor cells in a circuit design in accordance with one embodiment of the invention. In general, the placement of decap cells is performed on each region (or area) of an integrated circuit design.

Figure 4:
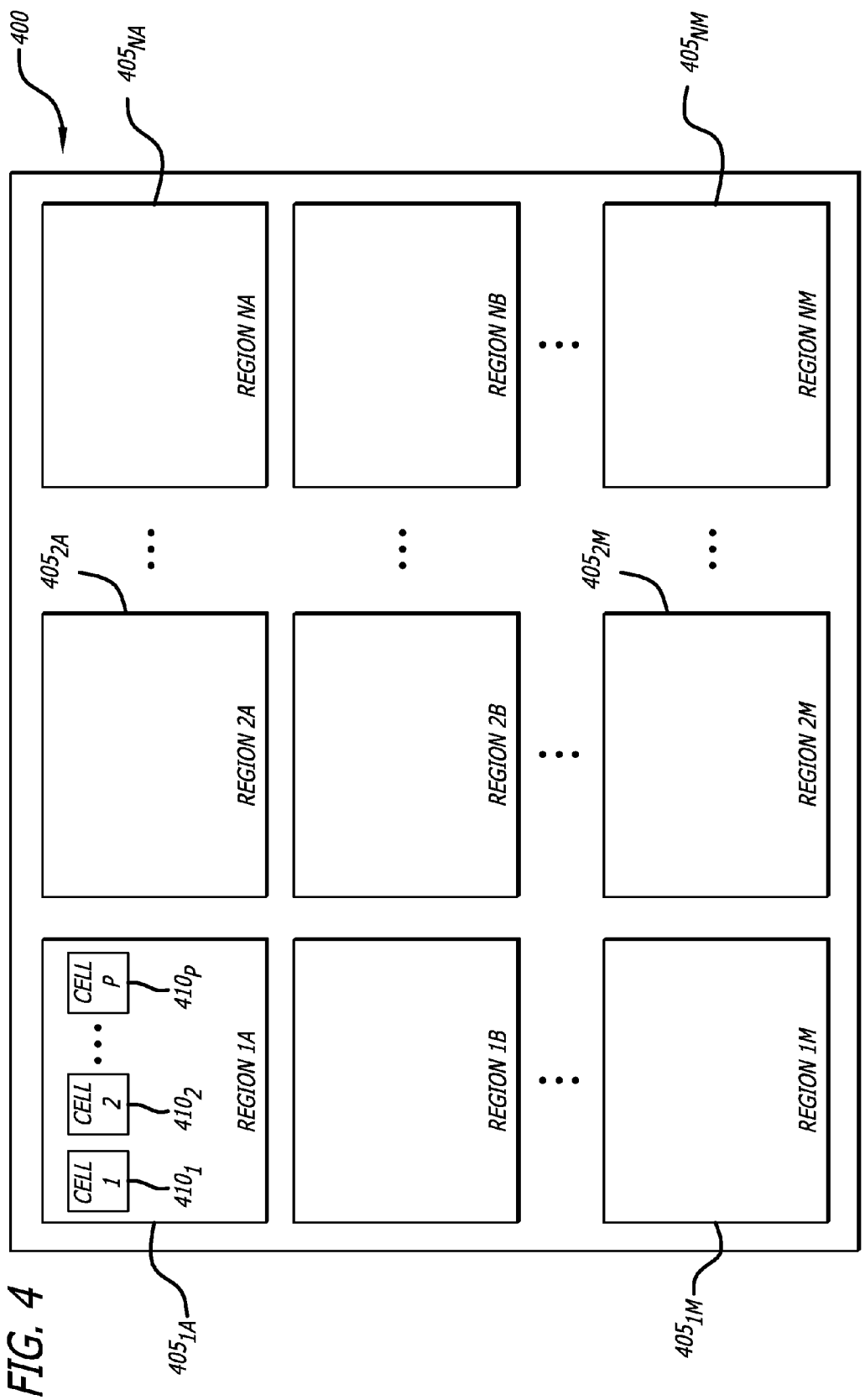
FIG. 4 illustrates an exemplary organization of a circuit design in accordance with one embodiment of the invention.

FIG. 4 illustrates an exemplary organization of a circuit design 400 in accordance with one embodiment of the invention. As shown in FIG. 4, the circuit design 400 may be divided or partitioned into N by M regions (or areas) of predetermined size, including $Region_{1A}$ $405_{1A}$ through $Region_{NM}$ $405_{NM}$. The N by M regions may be non-overlapping rectangular areas that partition the layout design of the integrated circuit. Alternatively, the N by M regions may be overlapping and non-overlapping polygonal areas that partition the layout design of the integrated circuit. In one embodiment of the invention, the size of each region ($Region_{1A}$ $405_{1A}$ through $Region_{NM}$ $405_{NM}$) is a square of approximately 100 microns (μm)×100 microns (μm). Each region ($Region_{1A}$ $405_{1A}$ through $Region_{NM}$ $405_{NM}$) includes one or more logic cells. For example, $Region_{1A}$ may include P cells (Cell 1 $410_1$, Cell 2 $410_2$, . . . , Cell P $410_P$).

Returning to FIG. 3, the process of placing decoupling capacitor cells in a circuit design starts at block 301 and goes to block 304.

At block 304, if the standard cell library has yet to be characterized for instantaneous power switching, it is now characterized (block 306) to determine the inherent decoupling capacitance (IDC) of each cell and the needed decoupling capacitance (NDC) of each cell. If the standard cell library has already been characterized, the library characterization process (block 306) may be skipped and the process goes to block 310.

The logic cells in the standard cell library are characterized for instantaneous power needs. The switching power and leakage power from the cell library file (e.g. .lib) are used to find the amount of needed decoupling capacitance (NDC) to address the voltage drop (IR-drop) caused by each cell. The amount of needed decoupling capacitance (NDC) for each cell is used during the automatic placement of decap cells. Additionally, if the intrinsic decoupling capacitance for each cell is not provided, the layout and devices in each cell are analyzed with a given process technology file corresponding to the silicon manufacturing process.

Additionally, the process of automatic placement of decoupling capacitor cells in a circuit design may use information from a timing window file (TWF). The timing window file has activity information of switching time slots or timing windows in which the output of cell instances in a region may switch in a clock period. With the timing window information and the instantaneous power requirements, a decap cell size and a decap cell placement location may be determined within regions of the integrated circuit design.

In some cases, the data for the needed decoupling capacitance (NDC) and the timing window file (TWF) for each cell in a cell library may be unavailable. In case of missing characterized data, certain default values can be set. For example, an effective NDC per area of the cell size can be assumed. Generally, larger cell sizes result in more devices and a greater amount of switching. In case of missing TWF information, a unit delay can be added for each cell in a path between flip flops to determine timing information and timing window overlap in a region. While these are gross approximations, it is still possible to perform a decoupling capacitance analysis even though the most accurate data may not be available.

To be sure that each region of a plurality of regions in an integrated circuit are processed, a query may be made to determine if there are any other regions to process or whether all regions of the circuit design have been processed (block 310). If there is a region that has not been processed, the next unprocessed region is selected for automatic decap placement (block 312).

Given the selected region, timing window information of the all the logic cell instances in the selected region may be extracted from the results of a timing analysis. Typically, a timing analysis is performed during logic synthesis to generate the timing window information. Alternatively, the decap cell placement process may invoke a timing analyzer to determine the timing window information for the one or more logic cells in the given region. Moreover, a timing analysis may be performed during almost any process of the design flows illustrated in FIGS. 2A-2B. Generally, the accuracy of the timing analysis improves the further down into the design flow that it is performed.

Next at block 315, the automatic decap placement process is invoked to analyze the unprocessed region, determine the optimum decoupling capacitance for the region and whether any decap cell needs to be added to the region, and then places any needed decap cell. After processing a given region, the method returns to block 310 to determine if there is another unprocessed region. If it is determined that there are no further regions of the integrated circuit design that have not been analyzed (block 310), the process of placing decap cells in the circuit design terminates (block 320).

As mentioned previously, embodiments of the invention determine the optimum amount of decoupling capacitance for a given region to compensate for a voltage drop in the power grid. Various ways may be used to determine the optimum amount of decoupling capacitance for a given region. In one embodiment of the invention, a maximum NDC timing window of switching logic cells in a region is used as a basis to determine the optimum amount of decoupling capacitance for a given region. In another embodiment of the invention, statistical switching of the logic cells in the given region is used as a basis to determine the optimum amount of decoupling capacitance for a given region.

Max Switching Decap Cell Placement

Figure 5:
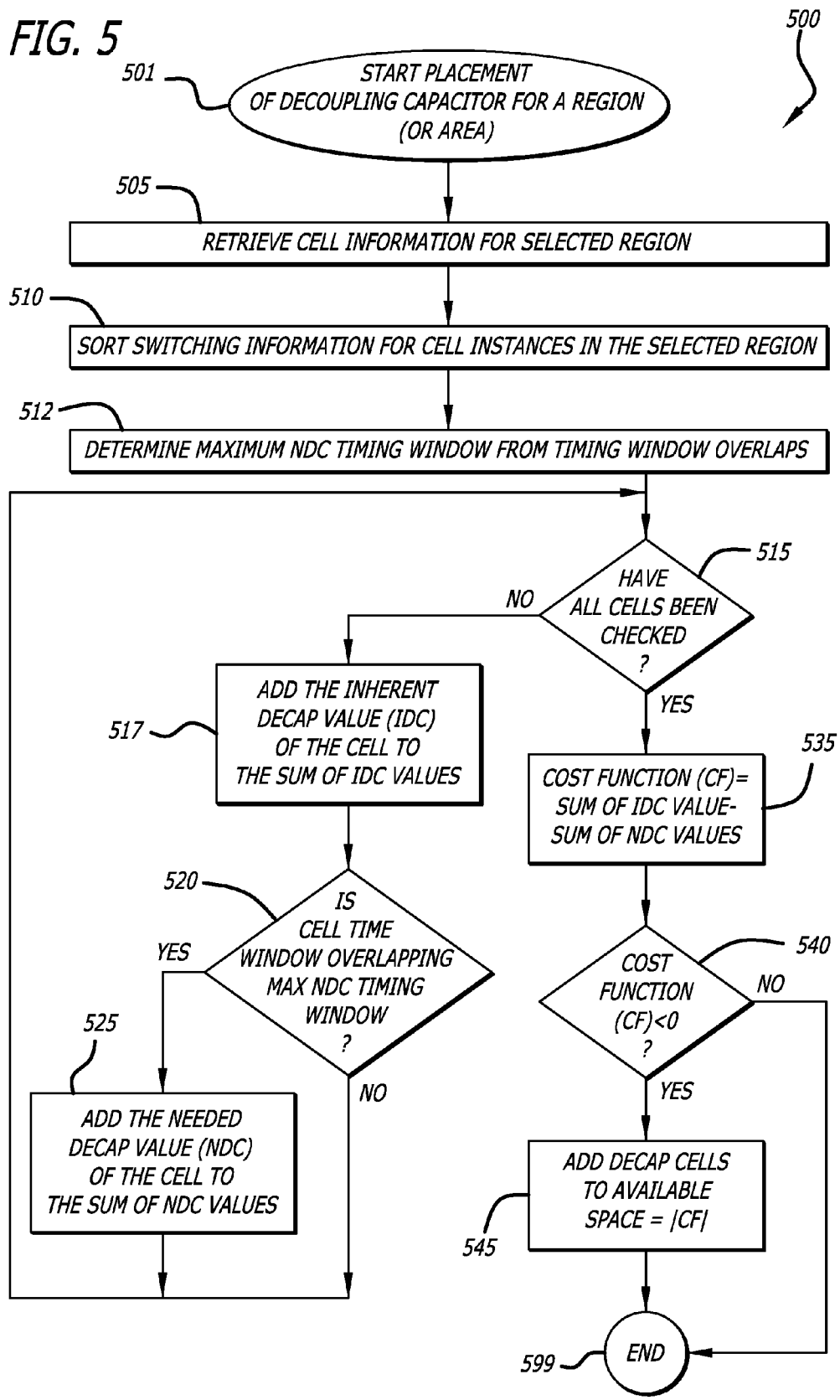
FIG. 5 shows a flow chart describing the process of placing decap cells in a region (or area) of the circuit design in accordance with one embodiment of the invention.

FIG. 5 is a flow chart illustrating an exemplary process 500 of placing decap cells in a region (or area) of the circuit design in accordance with one embodiment of the invention. The process 500 determines an optimum decoupling capacitance for a given region in the integrated circuit based on a maximum NDC timing window of the logic cells in the given region. A maximum switch timing overlap analysis is performed to determine the maximum NDC timing window. The maximum NDC timing window of the logic cells is determined over the clocking period for the integrated circuit. The maximum NDC timing window is a period of time where the switch timing windows of a plurality of logic cells overlap and presumably will source and/or sink the largest amount of current for which the optimum decoupling capacitance is to be determined. In one embodiment of the invention, the maximum needed decoupling capacitance (NDC) during periods of overlapping timing windows is used as an indicator for when the largest amount of current may be sourced or sinked.

The exemplary process 500 of placing decap cells of FIG. 5 is now described using FIGS. 6A-6D as examples.

Figure 6C:
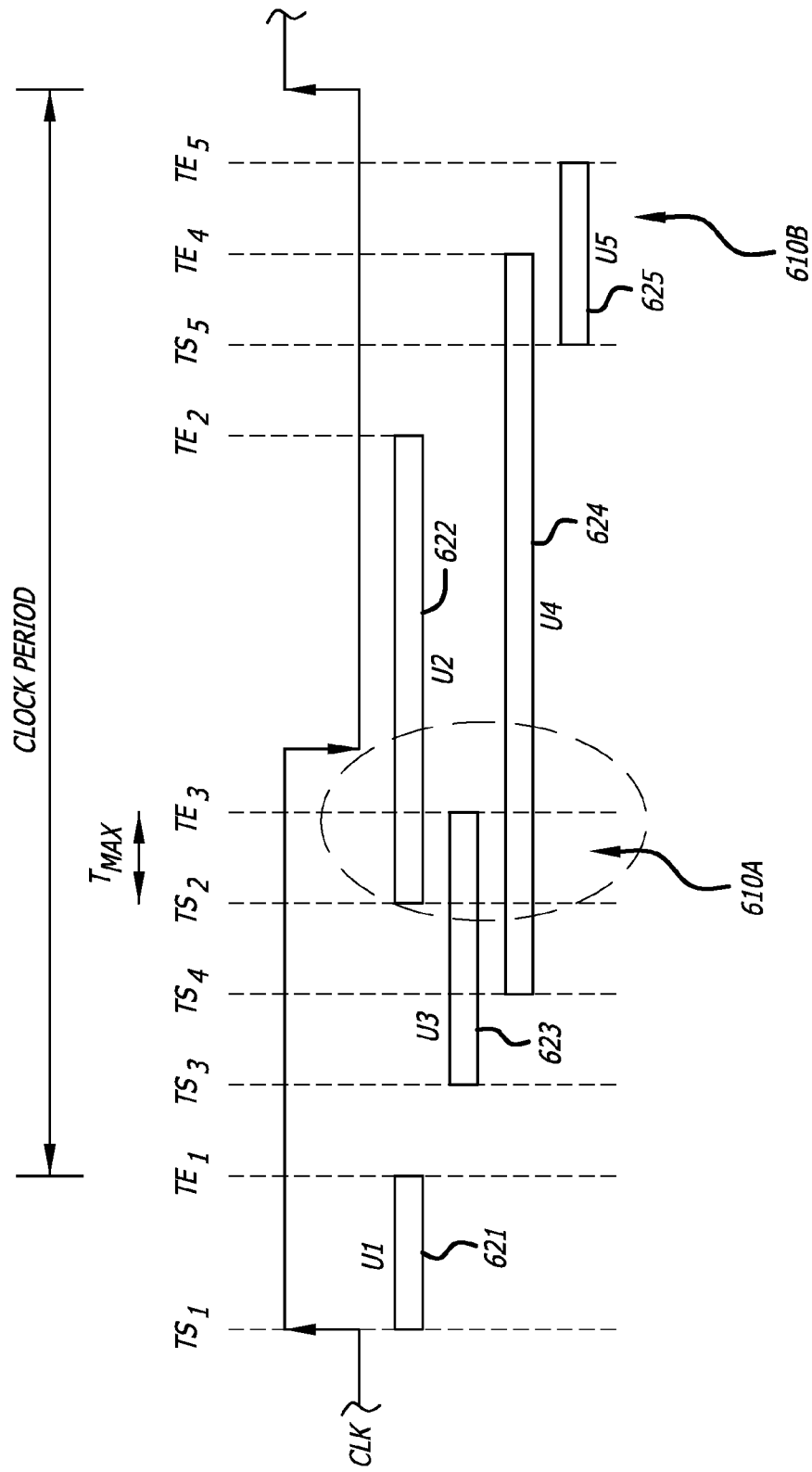
FIG. 6C is an exemplary timing diagram illustrating the time switching of instances of cells based on the exemplary timing information included in FIG. 6A.
Figure 6D:
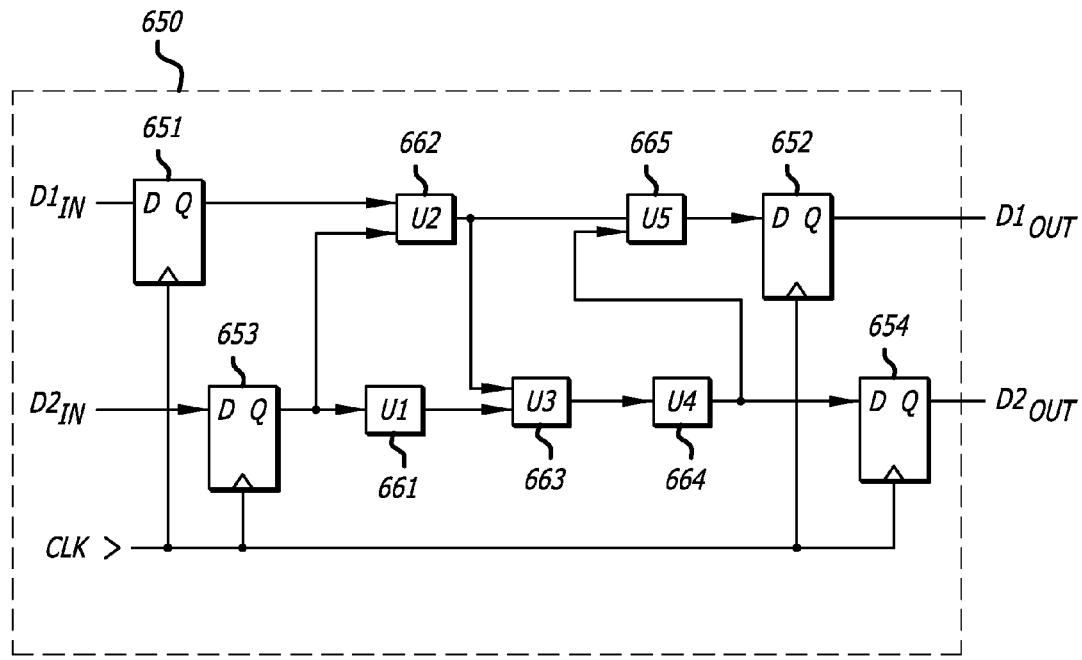
FIG. 6D illustrates a functional block diagram of a circuit corresponding to the exemplary timing diagram of FIG. 6C.

FIG. 6D illustrates an exemplary region 650 of an integrated circuit for analysis and automatic placement of decap cells. The exemplary region 650 includes a pair of data paths with logic cell instances U1-U5 661-665 between a pair of D-flip flops or registers 651-653. The D-flip flops or registers 651-653 are clocked by the same clock CLK for simplicity of explanation but could be clocked by different clocks in the exemplary region 650. In FIG. 6C, the timing windows 621-625 are associated with the outputs of the cell instances U1-U5 661-665. The process of automatic placement of decap cells starts at block 501 and then goes to block 505.

In block 505, information related to cells in a given region or area, such as region 650 illustrated in FIG. 6D is retrieved. FIGS. 6A and 6B are exemplary tables 600 and 605 of information related to the cells in a given region in accordance to one embodiment of the invention. In general, the timing window file or table 600 in FIG. 6A contains information of switching time windows or slots over the clock period for instances of cells in the region. Generally, the decap file or table 605 illustrated in FIG. 6B contains information related to the inherent decoupling capacitance of the logic cells and the needed decoupling capacitance of the logic cells characterized from the instantaneous power requirement of the cells. The needed decoupling capacitance for a voltage drop in a cell may be derived from the switching power and leakage power characteristics of the cell. The values for switching power and leakage power may be found in the technology file (".lib file") associated with the standard cell library. The inherent decoupling capacitance can be characterized from the layout of the cells in the standard cell library given the technology file. Alternatively, the decap file or table 605 may be included as part of the standard cell library with the information merely need to be extracted there-from for use.

More specifically, the table 600 in FIG. 6A contains the starting time (denoted TS) and the ending time (denoted TE) for timing windows 621-625 for instances (U1, U2, U3, U4, and U5) of the corresponding switching cells (Cell 2, Cell 5, Cell 9, Cell 4, and Cell 1), for example. As shown in the figure, the starting times for instances (U1, U2, U3, U4, and U5) of the cells (Cell 2, Cell 5, Cell 9, Cell 4, and Cell 1) are $TS_1$, $TS_2$, $TS_3$, $TS_4$, and $TS_5$, respectively. As further shown in FIG. 6A, the ending times for instances (U1, U2, U3, U4, and U5) of the cells (Cell 2, Cell 5, Cell 9, Cell 4, and Cell 1) are $TE_1$, $TE_2$, $TE_3$, $TE_4$, and $TE_5$, respectively.

Turning now to FIG. 6B, the table 605 in this figure contains information related the instantaneous power requirement of the cells. For example, the table 605 includes the inherent decoupling capacitance and the needed decoupling capacitance of the cells. The inherent decoupling capacitance (IDC) of a cell is generally the amount of decoupling capacitance that already exists in the logic cell from the intrinsic decoupling capacitance of the layers and devices as well as any added decoupling capacitance. As shown in FIG. 6B, Cell 1, Cell 2, ..., Cell 10 have inherent decoupling capacitance values of $IDC_1$, $IDC_2$, ..., $IDC_{10}$ respectively. The needed decoupling capacitance (NDC) of a cell is generally the amount of decoupling capacitance that an instance of the cell would require given its highest current drive and current leakage of electronic devices therein resulting in the worst case instantaneous power consumption and greatest potential local voltage drop in the power grid. Alternatively, the needed decoupling capacitance (NDC) of a cell can also be defined by each design or project as the amount of decap needed that does not allow the positive power supply voltage for the device to drop by x percent or the amount of decap needed that does not allow the negative power supply voltage (ground or VSS) for the device to increase by y percent. For example, a user may specify the needed decap in the x % of VDD, such as five percent. Alternatively, a user may specify the needed decap in y % of GND, such as five percent for example. As shown in FIG. 6B, Cell 1, Cell 2, ..., Cell 10 have the needed decoupling capacitance values of $NDC_1$, $NDC_2$, ..., $NDC_{10}$ respectively.

Returning to FIG. 5, in block 510, the instances of the cells in the region may be sorted by non decreasing values of start time to enable the identification of cells with overlapping time windows during a clock period. FIG. 6C is an exemplary timing diagram illustrating the time switching of instances (U1, U2, U3, U4, and U5) of the cells (Cell 2, Cell 5, Cell 9, Cell 4, and Cell 1) based on the exemplary timing information included in FIG. 6A.

Given the sorted table of timing windows, a determination of the maximum NDC timing window from the overlapping timing windows in the clock period for switching logic cells of the selected region is determined (block 512), if any. As shown in FIG. 6C, the timing windows 622-624 for cell instances U2, U3, and U4 overlap during the time period between $TS_4$ and $TE_2$ to form an area of timing window overlap 610A. While the timing windows 624 and 625 overlap during the clock time period between $TS_5$ and $TE_4$ to form an area of timing window overlap 610B, this overlap may not be the maximum NDC timing window for the given region in the clock period.

In one embodiment of the invention, the maximum NDC timing window may be determined by the maximum number of overlapping windows, such as three illustrated in FIG. 6C. In another embodiment of the invention, the maximum NDC timing window may be determined based on the maximum sum of needed decoupling capacitance for the cells with overlapping timing windows. For example, the NDC of the cell instances U2, U3, and U4 that may overlap in switching during the overlap 610A are summed together. The NDC of the cell instances U4 and U5 that may overlap in switching during the overlap 610B are summed together. The summed NDC for the window overlaps 610A and 610B are compared to determine which is greater, the greater of which is determined to be the maximum NDC timing window. For example, assuming the sum of the NDC of the cell instances U2, U3, and U4 is greater than the sum of NDC of the cell instances U4 and U5, the window overlap 610A is the maximum NDC timing window. Alternatively, the reverse may be true and the window overlap 610A may be assigned to be the maximum NDC timing window. If there is no overlap in any timing window for the logic cells in a given region, the maximum NDC timing window is set to a value, such as zero, to indicate that no decap cell may be needed.

The inherent decoupling capacitance (IDC) value for each cell in a region is useful over the entire clock period, including the period over which there is a maximum NDC timing window. Thus, a sum of all the inherent decoupling capacitance values (IDC) for all of the cells in the given region is made. Additionally, for the logic cells that may switch in the maximum NDC timing window, a sum of their needed decoupling capacitance values (NDC) is made. In the example shown in FIG. 6C, the timing windows 622, 623, 624 in the maximum NDC timing window 610A are associated with cell instances U2, U3, U4. Thus given the decoupling values in table 605 stored in a file, the values of NDC2, NDC3, and NDC4 are summed together to get an NDC value for the selected region during the time period TMAX of the maximum NDC timing window.

At block 515, a determination is made as to whether the decoupling capacitance values (IDC and NDC) of each cell and every cell in the region has been read. If not all of the cells have been read for their decoupling capacitance values, the next logic cell's inherent decoupling capacitance value (IDC) is added to the sum of IDC values for the region (block 517).

Next, a query is made to determine whether a cell has a timing window that overlaps with the maximum NDC timing window (block 520). If the cell's timing window overlaps into the maximum NDC timing window, its needed decoupling capacitance value (NDC) is added to the sum of NDC values for the region (block 525). Otherwise, if the cell has no overlapping timing window with the maximum NDC timing window, the process skips block 525 and returns to block 515 to determine if all logic cells used within the region have been considered.

Decap cells are added based on the total activity in a selected region. When timing windows of logic cells in same region switch in the maximum NDC timing window, decap cells may be added. If none of the timing windows of the logic cells in the region overlap, then decap cells may not be needed. In which case, the sum of NDC would be zero for the given region.

In the example shown in FIGS. 6A-6D, instances U2, U3, and U4 of Cell 5, Cell 9, and Cell 4 overlap with each other (see area 610A of FIG. 6C). Furthermore, Cell 5, Cell 9, and Cell 4 have NDC values of $NDC_5$, $NDC_9$, and $NDC_4$ respectively (see FIG. 6B). Thus during the maximum NDC timing window 610A, the resultant sum of NDC values for the selected region would be equal to $NDC_5+NDC_9+NDC_4$.

Note that the timing window 621 for the cell instance U1 of the Cell 2 does not overlap with any other timing window of any other cell. However, the sum of inherent decoupling capacitance (ICD) for the selected region from all cell instances therein compensates for the IR drop during the timing window 621 for the instance U1 of Cell 2. While Cell 2 may have an inherent decoupling capacitance value of only $IDC_1$, it is still useful over the entire clock period, including the period over which there is a maximum NDC timing window. Therefore, the sum of inherent decoupling capacitance (IDC) values in the exemplary region 650 would be equal to $IDC=IDC_1+IDC_2+IDC_3+IDC_4+IDC_5$.

After all the cells in the region (or area) have been checked, a cost function (CF) is computed by subtracting the sum of IDC values from the sum of NDC values (block 535). If the cost function (CF) is negative (block 540), the optimum decoupling capacitance for the region is determined and an equivalent value of decap cells (equivalent to CF) may be added to the available empty space in the selected region (block 545). That is, optimum decoupling capacitance for the region is found by the equation CF=(sum of all IDC) less (sum of NDC for cells with overlapping timing windows), if negative. If the cost function, CF, is positive, there is an excess of inherent decoupling capacitance and no further decap cell needs adding.

In one embodiment on the invention, if the given region does not have sufficient empty or open space to receive one or more decap cells, room may be made in the given region for the decap cells. One or more selected logic cells with minimal timing window overlap may be moved into adjoining regions to make room for the placement of the layout of the decap cells in the given region.

When the placement engine places the logic cell, the appropriate size of decap cell for the region may be placed right next to it to meet its power needs. Judiciously using decap cells to address the local voltage drop in this manner may reduce the die size to lower cost of the IC and reduce power consumption of the IC by reducing the number and size of decap cells.

Statistical Switching Decap Cell Placement

Instead of placing decap cells in a region with the logic cells based on maximized switching, the determination for adding decap cells in the region may be based on the statistical probability that the logic cells in the region will switch over a predetermined period of time, such as the maximum NDC timing window.

Consider once again FIGS. 6A-6D, for example. Further assume that the timing windows 622-624 overlapping each other form the maximum NDC timing window 610A with the time period TMAX. Statistical probability can be assigned to each of the cell instances that the output of the cell instance U2, U3, U4 will switch in the period between $TS_2$ and $TE_3$ ("TMAX") during the maximum NDC timing window 610A. The probability may be simply determined by dividing TMAX by each of their respective timing window periods or may be determined by the other more complex means. For example, the probability that U2 may switch during the maximum NDC timing window 610A may be determined from the equation $P_2=TMAX/(TE_2-TS_2)$. The probability that U3 may switch during the maximum NDC timing window 610A may be determined from the equation $P_3=TMAX/(TE_3-TS_3)$. The probability that U4 may switch during the maximum NDC timing window 610A may be determined from the equation $P_4=TMAX/(TE_4-TS_4)$. Because the cell instance U1 does not switch during the time period TMAX, its probability $P_1$ of switching during the maximum NDC timing window 610A is zero. Similarly the probability $P_5$ of the cell instance U5 switching during the maximum NDC timing window 610A is zero.

The needed decoupling capacitance in the region is determined based on these probabilities of the cell instances switching during the maximum NDC timing window. The NDC in the exemplary region 650 is the sum of the products of the respective probability multiplied by the needed decoupling capacitance for those cell instances switching during the maximum NDC timing window. Following along with the example with the decoupling capacitance file or table 605 illustrated in FIG. 6B, the NDC for the exemplary region 650 is equal to $P_1(NDC_1)+P_2(NDC_2)+P_3(NDC_3)+P_4(NDC_4)+P_5(NDC_5)$. Assuming the timing window 610A is the maximum NDC timing window with the timing windows for cell instances U2, U3, and U4 overlapping, $P_1=P_5=0$ and the equation further reduces to $P_2(NDC_2)+P_3(NDC_3)+P_4(NDC_4)$.

Given that the probabilities are less than 100%, the probabilistic approach to determining needed decoupling capacitance for a region is less conservative than just summing them together. This statistical approach, although more complicated, may more accurately model the need for decoupling capacitance within a region.

The inherent decoupling capacitance (IDC) in the given region is determined similarly by summing up all of the IDC for each cell instance within the given region. The optimum or needed decoupling capacitance in a region may be determined by subtracting the statistical NDC for the given region from the IDC for the given region. If the result is negative, there is a shortage of decoupling capacitance in the region and decap cells may be added. If the result is positive, there is an excess of decoupling capacitance in the region and decap cells need not be added therein.

The foregoing describes the manners in which decap cells may be automatically placed. This results in a more judicious use of silicon area as a more appropriate size and number of Decap cells being added at more appropriate locations in the integrated circuit layout.

Decoupling Capacitance Smoothing

In addition to placing decap cells in a region to compensate for the net difference between the needed capacitance NDC and the inherent capacitance IDC in the region, neighboring regions with excess inherent decoupling capacitance may be used to balance or smooth out the shortage of decoupling capacitance in other regions of the integrated circuit design.

Referring now to FIG. 11A, a matrix 1100A of decoupling capacitance information for N by M regions of an integrated circuit is illustrated. The matrix includes the regional inherent decoupling capacitance value (RIDC) and the regionally needed decoupling capacitance value (RNDC) for each. The RIDC value is the sum of the inherent decoupling capacitance of the cell instances in the selected region. RNDC value may be determined in various ways as described previously but is generally the needed decoupling capacitance for the selected region that is based on the need decoupling capacitance values of one or more logic cells in that selected region. The values for RIDC,RNDC for each $Region_{NM}$ is placed in the matrix.

A regionally optimum decoupling capacitance to place decap cells may be readily determined by taking the difference between the values RIDC,RNDC for the given region. In one embodiment of the invention, if the difference is negative there is a shortage of decoupling capacitance and if the difference is positive there is an excess of decoupling capacitance in the region. Alternatively, the signs may be swapped and provide the appropriate indication.

For example, consider Region1A with the values RIDC, RNDC being 5,10 (units typically in femto-farads) in matrix 1100A. In either case, the difference between these values for RIDC,RNDC is a resultant magnitude of 5 and indicating a shortage of inherent decoupling capacitance in Region1A. For further example, consider Region 2A with the values RIDC,RNDC being 10,2 (units typically in femto-farads) in matrix 1100A. The difference between these values for RIDC,RNDC is a resultant magnitude of 8 and indicating an excess of inherent decoupling capacitance in Region2A. With the given values in matrix 1100A, Region1B and Region2B also have excessive inherent decoupling capacitance.

Instead of just adding decap cells to Region1A, logic cells in the neighboring regions that have excessive inherent decoupling capacitance may be moved into regions having a shortage of inherent decoupling capacitance, to balance out the decoupling capacitance across the IC and avoid adding further decap cells and increasing leakage power consumption. Given the matrix 1100A of decoupling capacitance information, the decoupling capacitance across an integrated circuit may be balanced out.

For example, consider Region1B and Region2A with 9 and 8 units of excessive inherent decoupling capacitance, respectively. One or more logic cells with 3 units of excessive inherent decoupling capacitance may be moved from Region1B into $Region_{1A}$ to partially balance out the shortage in Region1A. One or more logic cells with 2 units of excessive inherent decoupling capacitance may be moved from Region2A into Region1A to balance out the shortage in Region1A. Thus, five units of inherent decoupling capacitance may be added into Region1A without adding additional decap cells, if the logic cells may be so moved.

FIG. 11B, illustrates a matrix 1100B of decoupling values after Region1A has been balanced out with the movement of logic cells from Region1B and Region2A. Region1A has values RIDC,RNDC of 10,10 units respectively in matrix 1100B. Region1B and Region2A have a reduction in RIDC. Region1B has values RIDC,RNDC of 7,1 units respectively in matrix 1100B. Region2A has values RIDC,RNDC of 8,2 units respectively in matrix 1100B.

In other regions of the integrated circuit, the neighboring regions may not be used to balance out the regional decoupling capacitance as they may all be deficient in RIDC in comparison with RNDC.

In FIG. 11A for example, while Region(N−1)A is balanced, RegionNA, Region(N−1)B, and RegionNB are all deficient in RIDC in comparison with RNDC. RegionNA may not be able to use its neighboring regions Region(N−1)A, Region(N−1)B, and RegionNB for example to balance out its deficiency in RIDC. Instead, decap cells with inherent decoupling capacitance (15, 25, 25 units respectively) may be added into RegionNA as well as Region(N−1)B and RegionNB.

FIG. 11B illustrates the matrix 1100B of decoupling values after decap cells have been added into RegionNA, Region(N−1)B, and RegionNB to address the shortage of RIDC therein. RegionNA has values RIDC,RNDC of 20,20 units respectively in matrix 1100B. Region(N−1)B has values RIDC, RNDC of 30,30 units respectively in matrix 1100B. RegionNB has values RIDC,RNDC of 40,40 units respectively in matrix 1100B.

While FIGS. 11A-11B illustrate using a matrix to determine how to balance out the decoupling capacitance and track the addition of decap cells, other devices may be used to mathematically do so.

Referring now to FIG. 12, a table 1200 of decoupling capacitance information for N by M regions of an integrated circuit is illustrated. Instead of a matrix array, a table may be used to sort through and balance out the decoupling capacitance over an integrated circuit layout design. Additionally, a value of regional optimum decoupling capacitance (RODC) may be computed by subtracting RIDC from RNDC, or visa versa. The table 1200 may be readily sorted on RODC to determine those regions with excess RIDC and those with a shortage of RIDC to assist in balancing out the decoupling capacitance across regions of an integrated circuit.

Computing System for Software Execution

Figure 7:
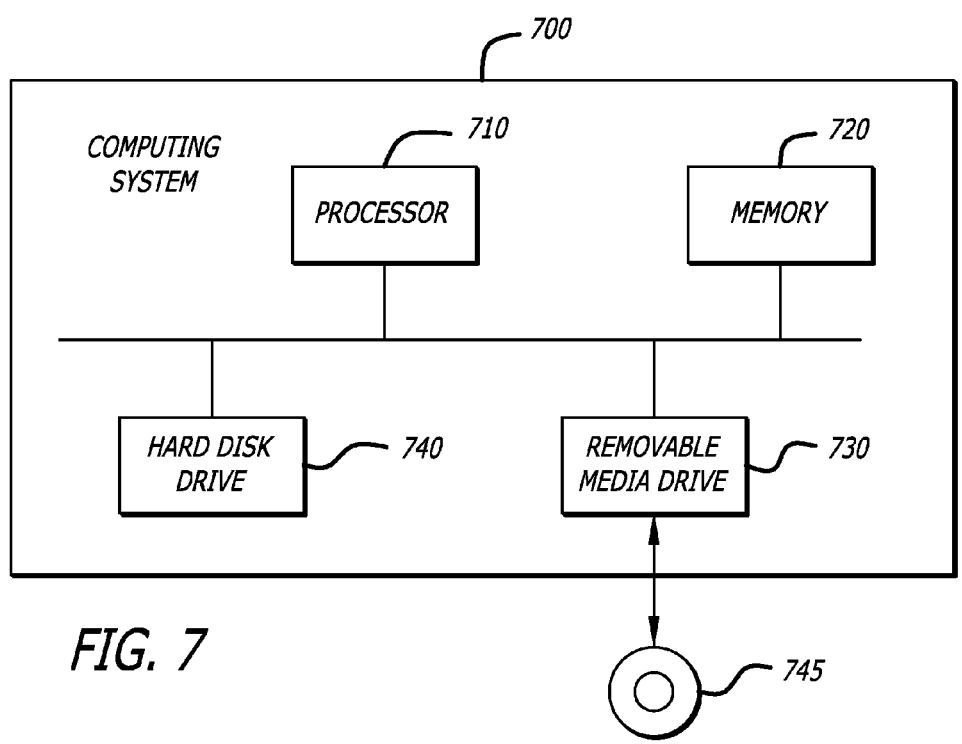
FIG. 7 illustrates an exemplary computing system that may be used to perform some or all of the processes in accordance with a number of embodiments of the invention.

Referring now to FIG. 7, a computing system 700 is illustrated that may be used to perform some or all of the processes in accordance with a number of embodiments of the invention. In one embodiment of the invention, the computing system 700 includes a processor 710, a memory 720, a removable media drive 730, and a hard disk drive 740. In one embodiment, the processor 710 executes instructions residing on a machine-readable medium, such as the hard disk drive 740, a removable medium (e.g., an optical medium (compact disk (CD), digital video disk (DVD), etc.), a magnetic medium (magnetic disk, a magnetic tape, etc.), or a combination of both. The instructions may be loaded from the machine-readable medium into the memory 720, which may include Random Access Memory (RAM), dynamic RAM (DRAM), etc. The processor 710 may retrieve the instructions from the memory 720 and execute the instructions to perform the operations described above.

Note that any or all of the components and the associated hardware illustrated in FIG. 7 may be used in various embodiments of the system 700. However, it should be appreciated that other configurations of the system 700 may include more or less devices than those shown in FIG. 7.

Some portions of the preceding detailed description may have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The embodiments of the invention also relates to an apparatus for performing the operations described herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will appear from the description below. In addition, the embodiments of the invention are not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

CONCLUSION

The embodiments of the invention have a number of advantages, including reduction in leakage power in the overall IC design, reduced die size, improved performance, improved ASIC design flow, and faster time to market.

Additionally, while the system, method, and apparatus for placing decoupling capacitors automatically is disclosed by reference to the various embodiments and examples detailed above, it should be understood that these examples are intended in an illustrative rather than limiting sense, as it is contemplated that modifications will readily occur to those skilled in the art which are intended to fall within the scope of the embodiments of the invention. Rather, the embodiments of the invention should be construed by the claims that follow below.

What is claimed is:

1. A method for designing an integrated circuit, the method comprising:
    generating a plurality of regions of an integrated circuit layout including a first region of the integrated circuit layout with one or more logic cells to couple to a power grid;
    statically analyzing, with a computer, each of the one or more logic cells in the first region of the integrated circuit layout to determine an optimum amount of decoupling capacitance for the first region to compensate for a voltage drop in the power grid; and
    in response to the optimum amount of decoupling capacitance for the first region, adding at least one decoupling capacitor cell to the integrated circuit layout in the first region to compensate for the voltage drop in the power grid.

2. The method of claim 1, wherein
    the adding of the at least one decoupling capacitor cell to the integrated circuit layout in the first region includes moving at least one logic cell out of the first region into a neighboring region to make room for the addition of the at least one decoupling capacitor cell.

3. The method of claim 1, wherein
    a decoupling capacitor in the at least one decoupling capacitor cell is a junction capacitor.

4. The method of claim 1, wherein
    a decoupling capacitor in the at least one decoupling capacitor cell is an oxide capacitor.

5. The method of claim 1, wherein
    the analyzing each of the one or more logic cells in the first region to determine the optimum amount of decoupling capacitance for the first region includes
        summing together the inherent decoupling capacitance of each of the one or more logic cells in the first region to determine the regionally inherent decoupling capacitance;
        determining the regionally needed decoupling capacitance for the first region; and
        subtracting the regionally needed decoupling capacitance for the first region from the regionally inherent decoupling capacitance to determine the optimal decoupling capacitance for the first region.

6. The method of claim 5, wherein
    the analyzing each of the one or more logic cells in the first region to determine the optimum amount of decoupling capacitance for the first region further includes
        reading decoupling capacitance information for each of the one or more logic cells in the first region, the decoupling capacitance information including an inherent decoupling capacitance value for each of the one or more logic cells in the first region; and
        summing together the inherent decoupling capacitance values of the plurality of logic cells having the portion of their timing windows overlapping.

7. The method of claim 6, wherein
    the decoupling capacitance information further includes a needed decoupling capacitance value for each of the one or more logic cells in the first region, and the analyzing each of the one or more logic cells in the first region to determine the optimum amount of decoupling capacitance for the first region further includes
reading timing window information for each of the one or more logic cells in the first region, a timing window to indicate a range of time in a clock period for possible output switching of a logic cell;
determining a maximum needed decoupling capacitance timing window in response to a plurality of logic cells having a portion of their timing windows overlapping;
summing together the needed decoupling capacitance values of the plurality of logic cells having the portion of their timing windows overlapping; and
subtracting the sum of the needed decoupling capacitance values from the sum of the inherent decoupling capacitance values to determine the optimum amount of decoupling capacitance for the first region.

8. The method of claim 6, wherein
the decoupling capacitance information further includes a needed decoupling capacitance value for each of the one or more logic cells in the first region, and
the analyzing each of the one or more logic cells in the first region to determine the optimum amount of decoupling capacitance for the first region further includes
reading timing window information for each of the one or more logic cells in the first region, a timing window to indicate a range of time in a clock period for possible output switching of a logic cell;
determining a maximum needed decoupling capacitance timing window in response to a plurality of logic cells having a portion of their timing windows overlapping;
determining a switching probability for each of the plurality of logic cells having the portion of their timing windows overlapping in the maximum needed decoupling capacitance timing window;
summing together the products of the switching probability and the needed decoupling capacitance values for the plurality of logic cells having the portion of their timing windows overlapping; and
subtracting the sum of the products of switching probability and the needed decoupling capacitance values from the sum of the inherent decoupling capacitance values to determine the optimum amount of decoupling capacitance for the region.

9. The method of claim 1, further comprising:
balancing the decoupling capacitance values between a plurality of regions in the integrated circuit.

10. The method of claim 9, wherein:
the balancing of the decoupling capacitance values between the plurality of regions in the integrated circuit includes
moving at least one logic cell out of a region with an excess of inherent decoupling capacitance into a neighboring region with a shortage of inherent decoupling capacitance.

11. The method of claim 1, wherein
a second region of the integrated circuit layout includes one or more logic cells to couple to the power grid, and
the method further includes
analyzing each of the one or more logic cells in the second region to determine an optimum amount of decoupling capacitance for the second region to compensate for the voltage drop in the power grid; and
in response to the optimum amount of decoupling capacitance for the second region, adding at least one decoupling capacitor cell to the integrated circuit layout in the second region to compensate for the voltage drop in the power grid.

12. The method of claim 1, wherein
each of the plurality of regions of the integrated circuit layout has a substantially equivalent area.

13. A process for designing an integrated circuit comprising:
synthesizing a netlist of logic cells and wire connection between pins of the logic cells;
within a given region of a plurality of regions in the integrated circuit, placing a layout of each logic cell in the given region in response to the netlist;
determining, with a processor, the optimum decoupling capacitance for the given region in response to the placing of the layout of each logic cell in the given region; and
placing a layout of one or more decoupling capacitance cells between power and ground in the given region if a sum of the inherent decoupling capacitance of the logic cells in the given region is less than the optimum decoupling capacitance for the given region.

14. The process of claim 13, wherein
the optimum decoupling capacitance for the given region is determined by a maximum switch timing overlap analysis.

15. The process of claim 13, wherein
the optimum decoupling capacitance for the given region is determined by a statistical switching analysis.

16. The process of claim 13, wherein
for a next region of the plurality of regions in the integrated circuit, repeating
the placing of the layout of each logic cell in the next region in response to the netlist;
the determining the optimum decoupling capacitance for the next region; and
the placing of the layout of one or more decoupling capacitance cells between power and ground in the next region if a sum of the inherent decoupling capacitance of the logic cells in the next region is less than the optimum decoupling capacitance for the next region.

17. The process of claim 16, further comprising:
after completing the placement of the layout of one or more decoupling capacitance cells in those regions of the plurality of regions requiring additional decoupling capacitance,
routing the power grid in the integrated circuit.

18. The process of claim 17, further comprising:
after completing the placement of the layout of one or more decoupling capacitance cells in those regions of the plurality of regions requiring additional decoupling capacitance,
routing the wire interconnect between pins of each of the one or more logic cells in each of the plurality of regions in response to the netlist of the integrated circuit.

19. The process of claim 13, further comprising:
prior to the placement of the layout of one or more decoupling capacitance cells, optimizing the placement of the layout of the logic cells in the given region for timing and power conservation.

20. A machine-readable product for designing an integrated circuit, the machine-readable product comprising:
a machine readable storage device having stored therein machine readable program code to place one or more decoupling capacitance cells in a first region of a plurality of regions in an integrated circuit layout to couple to a power grid;

machine readable program code to sum the inherent decoupling capacitance of each logic cell in the first region of the integrated circuit layout to determine the regional inherent decoupling capacitance;

machine readable program code to determine the regionally needed decoupling capacitance for the first region; and machine readable program code to determine the difference between the regional inherent decoupling capacitance and the regionally needed decoupling capacitance to determine the optimum decoupling capacitance to place the one or more decoupling cells in the first region.

21. The machine-readable product of claim 20, wherein the machine readable storage device is a magnetic storage device or an optical storage device.

22. The machine-readable product of claim 20, wherein the machine readable storage device further has stored therein machine readable program code to balance the decoupling capacitance values between a plurality of regions in the integrated circuit.

23. A system for designing an integrated circuit, the system comprising:

a processor to execute instructions;

a storage device coupled to the processor, the storage device including instructions stored therein that when executed cause the processor to generate a plurality of regions of an integrated circuit layout including a first region of the integrated circuit layout with one or more logic cells to couple to a power grid;

statically analyze each of the one or more logic cells in the first region of the integrated circuit layout to determine an optimum amount of decoupling capacitance for the first region to compensate for a voltage drop in the power grid; and in response to the optimum amount of decoupling capacitance for the first region, add at least one decoupling capacitor cell to the integrated circuit layout in the first region to compensate for the voltage drop in the power grid.

24. The system of claim 23, wherein to add the at least one decoupling capacitor cell to the integrated circuit layout in the first region, the storage device further includes instructions stored therein that when executed cause the processor to move at least one logic cell out of the first region into a neighboring region to make room for the addition of the at least one decoupling capacitor cell.

25. The system of claim 23 wherein to analyze each of the one or more logic cells in the first region to determine the optimum amount of decoupling capacitance for the first region, the storage device further includes instructions stored therein that when executed cause the processor to sum together the inherent decoupling capacitance of each of the one or more logic cells in the first region to determine the regionally inherent decoupling capacitance;

determine the regionally needed decoupling capacitance for the first region; and subtract the regionally needed decoupling capacitance for the first region from the regionally inherent decoupling capacitance to determine the optimal decoupling capacitance for the first region.

26. The system of claim 23, wherein to analyze each of the one or more logic cells in the first region to determine the optimum amount of decoupling capacitance for the first region, the storage device further includes instructions stored therein that when executed cause the processor to read decoupling capacitance information for each of the one or more logic cells in the first region, the decoupling capacitance information including an inherent decoupling capacitance value for each of the one or more logic cells in the first region; and sum together the inherent decoupling capacitance values of the plurality of logic cells having the portion of their timing windows overlapping.

* * * * *